US006500599B1

(12) United States Patent
Inno et al.

(10) Patent No.: US 6,500,599 B1
(45) Date of Patent: Dec. 31, 2002

(54) LITHOGRAPHIC PRINTING PLATE PRECURSOR AND PLATE-MAKING METHOD OF LITHOGRAPHIC PRINTING PLATE USING THE SAME

(75) Inventors: Toshifumi Inno, Shizuoka (JP); Hiromichi Tachikawa, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/598,444

(22) Filed: Jun. 22, 2000

(30) Foreign Application Priority Data

| | | |
|---|---|---|
| Jul. 5, 1999 | (JP) | 11-190785 |
| Feb. 17, 2000 | (JP) | 2000-039696 |

(51) Int. Cl.[7] .................................................. G03F 7/11
(52) U.S. Cl. ..................................... 430/273.1; 430/302
(58) Field of Search ........................... 430/270.1, 272.1, 430/273.1, 281.1, 302, 303, 944, 945

(56) References Cited

U.S. PATENT DOCUMENTS

| | | | | | |
|---|---|---|---|---|---|
| 5,379,698 | A | * | 1/1995 | Nowak et al. | 101/454 |
| 5,888,696 | A | * | 3/1999 | Hirano et al. | 430/272.1 |
| 5,919,600 | A | * | 7/1999 | Huang et al. | 430/272.1 |
| 5,962,188 | A | * | 10/1999 | DeBoer et al. | 430/273.1 |
| 5,985,515 | A | * | 11/1999 | Van Rompuy et al. | 430/272.1 |
| 6,010,817 | A | * | 1/2000 | Van Damme et al. | 430/200 |
| 6,090,524 | A | * | 7/2000 | DeBoer et al. | 430/272.1 |
| 6,110,645 | A | * | 8/2000 | DeBoer et al. | 430/302 |
| 6,136,508 | A | * | 10/2000 | DeBoer et al. | 430/302 |
| 6,207,348 | B1 | * | 3/2001 | Deboer et al. | 430/302 |
| 6,228,559 | B1 | * | 5/2001 | Oda | 430/272.1 |
| 6,340,526 | B1 | * | 1/2002 | Inno et al. | 428/391 |
| 2002/0012881 | A1 | * | 1/2002 | Inno et al. | 430/303 |
| 2002/0068239 | A1 | * | 6/2002 | Van Damme et al. | 430/273.1 |

FOREIGN PATENT DOCUMENTS

| | | | |
|---|---|---|---|
| EP | 763 424 A2 | * | 3/1997 |
| WO | WO 98/34796 | * | 8/1998 |
| WO | WO-99/19143 | * | 4/1999 |

OTHER PUBLICATIONS

Brook, Michael A. Silicon in Organic, Organometallic, and Polymer Chemistry, New York: John Wiley & Sons, Inc., 2000, pp. 256–259.*

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

Disclosed are a lithographic printing plate precursor that can record images by laser beam scanning exposure based on digital signals and can be printed by easy development processing or development processing on a printing machine, comprising a support having thereon an ink-receptive light-heat conversion layer containing a compound converting laser light to heat and a hardened hydrophilic layer in this order, wherein a part of said light-heat conversion layer remains at a laser light-irradiated area of the lithographic printing plate precursor, and a plate-making method of a lithographic printing plate using the same.

2 Claims, No Drawings

LITHOGRAPHIC PRINTING PLATE PRECURSOR AND PLATE-MAKING METHOD OF LITHOGRAPHIC PRINTING PLATE USING THE SAME

FIELD OF THE INVENTION

The present invention relates to a lithographic printing plate precursor, and particularly to a novel lithographic printing plate precursor from which a printing plate can be easily prepared and a plate-making method of a lithographic printing plate using the same. More particularly, the invention relates to a lithographic printing plate precursor that can record images by laser beam scanning exposure based on digital signals and can be printed by easy development processing or development processing on a printing machine (i.e., a printing press), and a plate-making method of a lithographic printing plates using the same.

BACKGROUND OF THE INVENTION

In general, lithographic printing plate precursors comprise lipophilic image areas receiving ink in the printing process and hydrophilic non-image areas receiving fountain solution. As such lithographic printing plate precursors, presensitized plates have hitherto been widely used in which lipophilic light-sensitive resin layers are formed on hydrophilic supports. In plate-making methods thereof, after exposure through images of lithographic films, the non-image areas are usually removed by dissolving them in developing solutions, thereby obtaining desired printing plates.

The process for making the conventional presensitized plates requires the operation of removing the non-image areas by dissolution after exposure, and it is one problem that has been desired to be improved with respect to the prior art to make unnecessary or simplify such additional wet treatment. In particular, the disposal of waste liquid discharged by the wet treatment has recently become a matter of concern in the whole industry from the consideration to the earth circumstances, so that a request for an improvement in this respect has become stronger.

As one of easy plate making methods meeting this request, a method is proposed in which such image recording layers that the non-image areas of the printing plate precursors can be removed in the usual printing process are used and developed on a printing machine after exposure to obtain final printing plates. The plate-making system of the lithographic printing plates by such a method is called an "on-machine (i.e., on-press) development system". Specific examples thereof include the use of image recording layers soluble in fountain solutions or ink solvents and mechanical removal of image recording layers by contact with an impression cylinder or a blanket cylinder in the printing machine. However, a large problem of the on-machine development system is that it is necessary to employ, for example, a troublesome method of keeping the printing plate precursors in a completely light-shielded state or under constant-temperature conditions until the precursors are mounted on the printing machine, because the image recording layers of the precursors are not fixed even after exposure.

On the other hand, as another recent trend in this field, digitizing techniques of electronically processing, accumulating and outputting image information by the use of computers have been widely applied, and various new image output systems corresponding to such digitizing techniques have come in practice. Associated therewith, computer-to-plate techniques have been noted in which high convergent radiations such as laser beams bear digitized image information, and printing plate precursors are subjected to scanning exposure to the radiations, thereby directly produce printing plates through no lithographic films. Resulting therefrom, it becomes an important technical problem to obtain printing plate precursors adapted to this object.

Accordingly, simplification, conversion to a dry system and dispensing with treatment of the plate-making operation have been desired more strongly than before, from both the above-mentioned circumstance problem and adaption to digitizing.

Recently, solid lasers such as semiconductor lasers and YAG lasers, which are high in output, have become available at low cost. Accordingly, the prospects for the plate-making methods using these lasers as image recording means have become particularly encouraging, as another one of the methods for producing the printing plates by scanning exposure that can be easily incorporated in the digitizing technique. In the conventional plate-making methods, low- to medium-illuminance imagewise exposure is given to light-sensitive printing plate precursors to carry out image recording according to imagewise physical property changes of precursor faces by the photochemical reaction. However, in the methods using high power density exposure using high output lasers, exposure regions are intensively irradiated with a large amount of light energy during momentary exposure time to efficiently convert light energy to heat energy, and chemical changes, phase changes and physical changes such as changes in shape or structure are allowed to occur by that heat to utilize those changes for image recording. That is to say, although image information is inputted by light energy of laser light, image recording is conducted by the reaction due to heat energy. Usually, the recording system utilizing heat generation caused by such high power density exposure is called heat-mode recording, and conversion of light energy to heat energy is called light-heat conversion.

The great advantage of the plate-making methods using heat-mode recording means is that the precursors are not sensitive to light of the usual illuminance level such as room illumination, and that fixing is not indispensable to images recorded by high illuminance exposure. That is to say, when heat-mode light-sensitive materials are used in image recording, they are safe to room light before exposure, and the fixing of images is not indispensable also after exposure. Accordingly, when the plate-making process of using, for example, image recording layers insolubilized or solubilized by heat-mode exposure, and removing the exposed image recording layers imagewise to form printing plates is carried out by the on-machine development system, such printing systems that images are not influenced by development (removal of non-image areas) for a certain period of time after image exposure, for example, even if exposed to room environmental light, become possible.

It is therefore expected that the use of the heat-mode recording will make it possible to obtain lithographic printing plate precursors desirable for the on-machine development system.

WO94/18005 discloses lithographic printing plate precursors comprising supports having provided thereon hydrophilic cross-linked layers and recording layers and the plate making of which can be similarly carried out without development. In these printing plate precursors, it is necessary to scrape away substantially all of the hydrophilic layers and recording layers of laser-exposed areas to expose surfaces of the ink-receptive supports or ink-receptive layers under the recording layers, which is considered to raise problems with regard to simplicity of processing and ink consumption in printing.

The plate-making and printing methods utilizing the heat-mode image recording have advantages that printing plates can be directly produced from camera-ready copies through no films, so that the plate making on the machine is also possible and the development operation is also dispensable. However, they have weak points such as the above-mentioned insufficient heat-mode sensitivity, the difference in sensitivity between the surfaces and bottom portions of the image recording layers, the complexity of multiple constituting layers and the insufficient discrimination between the image areas and the non-image areas. Accordingly, the requests of the market requiring lithographic printing plate precursors in which the advantages of the plate-making and printing methods of the heat-mode image recording system are utilized and both the print quality and the printing durability are improved, are not sufficiently satisfied yet in the present circumstances.

SUMMARY OF THE INVENTION

It is therefore an object of the invention to overcome the above-mentioned defects of the heat-mode plate-making system, and namely, to provide a lithographic printing plate precursor in which scanning exposure of an image to laser light for a short period of time is possible, which can be operated by easy water development processing or can be directly mounted on a printing machine, requiring no development processing, to conduct plate making, and which is excellent in printing durability, also gives few print stains onto a printed face and has good image reproducibility.

Another object of the invention is to provide a plate-making method of a lithographic printing plate using the lithographic printing plate precursor.

For attaining the objects described above, the present inventors have made search for the constitution increasing the discrimination action between image areas and non-image areas and also having characteristics necessary for printing plates such as stain resistance and printing durability. As a result, the inventors have discovered that the above-mentioned objects can be attained by providing an ink-receptive light-heat conversion layer containing a compound converting laser light to heat and a hardened hydrophilic layer on a support, cross-linking the light-heat conversion layer, and further limiting the range of the coated dry weight of the light-heat conversion layer, thus completing the invention.

That is to say, the invention is as follows:

(1) A lithographic printing plate precursor comprising a support having thereon an ink-receptive light-heat conversion layer containing a compound converting laser light to heat and a hardened hydrophilic layer in this order, wherein a part of the light-heat conversion layer remains at a laser light-irradiated area of the lithographic printing plate precursor;

(2) The lithographic printing plate precursor described in (1), wherein the light-heat conversion layer has a cross-linked structure and is hardened;

(3) The lithographic printing plate precursor described in (1) or (2), wherein the light-heat conversion layer has a dry weight of 0.5 $g/m^2$ to 3 $g/m^2$; and (4) A method for producing a lithographic printing plate comprising conducting heat-mode imagewise exposure to the lithographic printing plate precursor described in any one of (1) to (3) by laser light irradiation, and during or after the laser light irradiation, removing the hydrophilic layer of the laser light-irradiated area, thereby forming an image of the ink-receptive light-heat conversion layer.

In the invention, laser light energy used for recording is absorbed by the light-heat conversion layer and converted to heat energy to cause chemical reactions or physical changes such as combustion, fusion, decomposition, vaporization and explosion, resulting in a reduction in adhesion between the light-heat conversion layer and the hydrophilic layer. Accordingly, the hydrophilic layer can be selectively easily removed, and the remaining light-heat conversion layer is removed to function as an ink-receptive layer.

In particular, the inventors have discovered that the effects are more strongly exhibited by allowing the light-heat conversion layer to have a cross-linked structure, and adjusting the light-heat conversion layer so as to have a coated dry weight ranging from 0.5 $g/m^2$ to 3 $g/m^2$, because the light-heat conversion layer remains at the exposed area.

As described above, the invention can provide the lithographic printing plate precursor in which heat-mode image exposure with laser light is possible, which can be operated by easy water development processing or can be directly mounted on a printing machine, requiring no development processing, to conduct plate making, and which is excellent in printing durability, also gives few print stains onto a printed face and has good image reproducibility; and the plate-making method of the lithographic printing plate using the same.

DETAILED DESCRIPTION OF THE INVENTION

The invention will:be described in detail below.

The lithographic printing plate precursor comprises the support having provided thereon the ink-receptive light-heat conversion layer containing the compound converting laser light to heat (also called a light-heat conversion agent), and the hardened hydrophilic layer provided on the light-heat conversion layer.

[Light-Heat Conversion Layer]

The light-heat conversion layer used in the invention is a layer having the function of converting laser light used for writing to heat (light-heat conversion) and further remaining at a laser light-irradiated area to function as an ink-receptive layer, and comprises at least (1) a light-heat conversion agent and (2) a binder polymer.

Further, for remaining at the laser-irradiated area after laser exposure and removal of the laser-exposed area of the hydrophilic layer and functioning as the ink-receptive layer, the light-heat conversion layer of the invention is preferably hardened with a cross-linking agent.

(1) The light-heat conversion agents used in the invention include organic pigments such as acidic carbon black, basic carbon black, neutral carbon black, carbon black surface-modified or surface-coated for improving its dispersibility and Nigrosine pigments; organic dyes such as compounds described in Matsuoka, *Infrared Sensitizing Dyes,* Plenum Press, New York (1990), U.S. Pat. No. 4,833,124, EP-A-321,923, U.S. Pat. Nos. 4,772,583, 4,942,141, 4,948,776, 4,948,777, 4,948,778, 4,950,639, 4,912,083, 4,952,552 and 5,023,229; metals or metal oxides such as aluminum, indium tin oxide, tungsten oxide, manganese oxide and titanium oxide. Besides, conductive polymers such as polypyrrole and polyaniline can also be used. The amount thereof used is from 5% to 50% by weight, preferably from 8% to 45% by weight, and more preferably from 10% to 40% by weight, based on the total solid weight of light-heat conversion layer.

As (2) the binder polymers used in the invention, well-known polymers having film forming ability and dissolving or dispersing the light-heat conversion agents are used. Examples thereof include cellulose and cellulose derivatives such as nitrocellulose and ethyl cellulose; homopolymers and copolymers of acrylic esters and methacrylic esters such as polymethyl methacrylate and polybutyl methacrylate; polystyrene and homopolymers or copolymers of styrenic monomers such as α-methylstyrene; various synthetic rubbers such as isoprene rubber and styrene-butadiene rubber; homopolymers of vinyl esters such as polyvinyl acetate and copolymers thereof such as vinyl acetate-vinyl chloride copolymers; various condensation polymers such as polyureas, polyurethanes, polyesters and polycarbonates; and binders used in a so-called "chemical amplification system", described in Frechet et al., *J. Imaging Sci.,* 30(2), 59–64 (1986), Ito and Willson, *Polymers in Electronics* (*Symposium Series*), 11,242, T. Davidson, Ed., ACS Washington, D.C. (1984), and E. Reichmanis and L. F. Thompson, *Microelectronic Engineering,* 13, 3–10 (1991).

Of these, polymers having functional groups usable in the cross-linking reaction for hardening the light-heat conversion layers by cross-linking are preferred.

Preferred examples of the functional groups include —OH, —SH, —NH$_2$, —NH—, —CO—NH$_2$, —CO—NH—, —O—CO—NH—, —NH—CO—NH—, —CO—OH, —CO—O—, —CO—O—,: —CS—OH, —CO—SH, —CS—SH, —CO—O—CO—, —SO$_3$H, —SO2(O$^-$), —PO$_3$H$_2$, —PO(O$^-$)$_2$, —SO$_2$—NH$_2$, —SO$_2$—NH—, —CO—CH$_2$—CO—, —CH=CH—, —CH=CH$_2$, :—CO—CH=CH$_2$, —CO—C(CH$_3$)=CH$_2$ and the following functional groups.

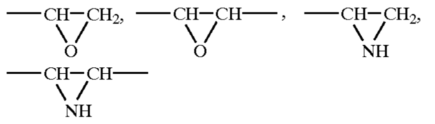

In particular, hydroxyl, amino, carboxyl, epoxy and polymerizable vinyl groups are preferred.

Preferred examples of the binder polymers of the invention include homopolymers or copolymers of carboxyl group-containing monomers such as acrylic acid and methacrylic acid; homopolymers or copolymers of hydroxyl group-containing acrylic or methacrylic esters such as hydroxyethyl methacrylate and 2-hydroxypropyl acrylate; homopolymers or copolymers of epoxy group-containing acrylic or methacrylic esters such as glycidyl methacrylate; homopolymers or copolymers of N-alkylacrylamides and acrylamide; homopolymers or copolymers of reaction products of amines and glycidyl acrylate, glycidyl methacrylate or allylglycidyl; homopolymers or copolymers of p-hydroxystyrene and vinyl alcohol; and condensation products such as polyurethane resins, polyurea resins, polyamide (nylon) resins, epoxy resins, polyalkyleneimines, novolak resins, melamine resins and cellulose derivatives.

These polymers may be used either alone or as a combination of two or more of them. The amount thereof used is from 20% to 90% by weight, preferably from 25% to 80% by weight, and more preferably from 30% to 75% by weight, based on the total solid weight of light-heat conversion layer.

As the cross-linking reaction used in the hardening of the light-heat conversion layers of the invention, the formation of covalent bonds by heat or light or the formation of ionic bonds with multivalent metal salts is available. In the invention, it is also possible to harden the light-heat conversion layers with well-known cross-linking agents.

The well-known cross-linking agents include multifunctional isocyanate compounds, multifunctional epoxy compounds, multifunctional amine compounds, polyol compounds, multifunctional carboxyl compounds, aldehyde compounds, multifunctional (meth)acrylate compounds, multifunctional vinyl compounds, multifunctional mercapto compounds, multifunctional metal salt compounds, polyalkoxysilane compounds, polyalkoxytitanium compounds, polyalkoxyaluminum compounds, polymethylol compounds and polyalkoxymethyl compounds. It is also possible to add well-known reaction catalysts to accelerate the reaction.

The amount of these cross-linking agents used is from 0% to 50% by weight, preferably from 3% to 40% by weight, and more preferably from 5% to 35% by weight, based on the total weight of solid contained in a coating solution for the light-heat conversion layer.

In the light-heat conversion layers of the invention, other additives can be used. These additives are added depending on various purposes, for example, for improving the mechanical strength of the light-heat conversion layers, improving the laser recording sensitivity, improving the dispersibility of dispersed materials in the light-heat conversion layers, and improving the adhesion of the light-heat conversion layers to adjacent layers such as supports and primer layers.

For example, for improving the laser recording sensitivity, it is conceivable to add well-known compounds decomposed by heating to generate gas. In this case, the laser recording sensitivity can be improved by the rapid volume expansion of the light-heat conversion layers. Examples of these additives include azidodicarbonamide, sulfonylhydrazine and dinitrosopentamethylenetetramine.

Further, well-known compounds decomposed by heating to produce acidic compounds can be used as additives. The use of them in combination with the binders of the chemical amplification system largely decreases the decomposition temperature of materials constituting the light-heat conversion layers, and as a result, the laser recording sensitivity can be improved. Examples of these additives include various kinds of iodonium salts, sulfonium salts, phosphonium tosylate, oxime sulfonate, dicarbodiimide sulfonate and triazine.

When pigments such as carbon black are used in the light-heat conversion agents, the dispersibility of the pigments sometimes have an effect on the laser recording sensitivity. Accordingly, various kinds of pigment dispersing agents are used as additives.

For improving the adhesion, well-known adhesion improvers (for example, silane coupling agents and titanate coupling agents) may be used.

In addition, various additives such as surfactants for improving coating properties are used as needed.

The compositions for the light-heat conversion layers used in the invention are dissolved or dispersed in appropriate solvents, and applied onto substrates and dried. Examples of the solvents include 2-methoxyethanol, 2-methoxyethyl acetate, propylene glycol methylethyl acetate, methyl lactate, ethyl lactate, propylene glycol monomethyl ether, ethanol, isopropanol, methyl ethyl ketone, N,N-dimethylformamide, N,N-dimethylacetamide, tetrahydrofuran and dioxane. They may be used either alone or as a mixed solvent thereof.

The weight thereof coated is preferably from 0.5 g/m$^2$ to 3 g/m$^2$ by weight after drying. Less than 0.5 g/m$^2$ gives unfavorable results such as a decrease in laser recording sensitivity and a decrease in ink receptivity, whereas exceeding 3 g/m$^2$ results in a tendency to increase the consumption of ink, which is economically disadvantageous.

The hydrophilic layers used in the lithographic printing plate precursors of the invention will be described below.

[Hydrophilic Layer]

The hydrophilic layer used in the invention is a layer receiving and retaining;a fountain solution in printing and functioning as a non-image area, and a layer having a hardened, water-insoluble hydrophilic matrix.

Preferred examples of the hydrophilic matrixes of the hydrophilic layers used in the invention include organic hydrophilic matrixes obtained by cross-linking or pseudo cross-linking of organic hydrophilic polymers, and inorganic hydrophilic matrixes obtained by sol-gel conversion comprising the hydrolysis and condensation reaction of polyalkoxysilanes, titanates, zirconates or aluminates.

As the cross-linking reaction used in the formation of the organic hydrophilic matrixes of the hydrophilic layers of the invention, the formation of covalent bonds by heat or light or the formation of ionic bonds with multivalent metal salts is available.

As the organic hydrophilic polymers used in the invention, polymers having functional groups usable in the cross-linking reaction are preferred.

Preferred examples of the functional groups include —OH, —SH, $—NH_2$, —NH—, $—CO—NH_2$, —CO—NH—, —O—CO—NH—, —NH—CO—NH—, —CO—OH, —CO—O—, $—CO—O^-$, —CS—OH, —CO—SH, —CS—SH, $—SO_3H$, $—SO_2\ (O^-)$, $—PO_3H_2$, $—PO(O^{31})_2$, $—SO_2—NH_2$, $—SO_2—NH—$ and the following functional groups.

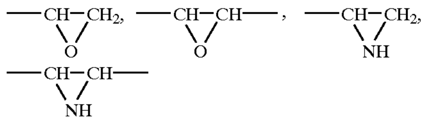

In particular, hydroxyl, amino, carboxyl and epoxy groups are preferred.

As such organic hydrophilic polymers of the invention, well-known water-soluble polymers can be used, and examples thereof include polyvinyl alcohol (polyvinyl acetate having a degree of saponification of 60% or more), modified polyvinyl alcohol such as carboxy-modified polyvinyl alcohol, starch and derivatives thereof, cellulose derivatives such as carboxymethyl cellulose, salts thereof and hydroxyethyl cellulose, casein, gelatin, gum arabic, polyvinyl-pyrrolidone, vinyl acetate-crotonic acid copolymers and salts thereof, styrene-maleic acid copolymers and salts thereof, polyacrylic acid and salts thereof, polymethacrylic acid and salts thereof, polyethylene glycol, polyethyleneimine, polyvinylsulfonic acid and salts thereof, polyhydroxyethyl methacrylate, polyhydroxyethyl acrylate and polyacrylamide.

These polymers may be used either alone or as a combination of two or more of them. The amount thereof used is from 20% to 99% by weight, preferably from 25% to 95% by weight, and more preferably from 30% to 90% by weight, based on the total solid weight of light-heat conversion layer.

In the invention, it is possible to cross-link the organic hydrophilic polymers with well-known cross-linking agents.

The well-known cross-linking agents include multifunctional isocyanate compounds, multifunctional epoxy compounds, multifunctional amine compounds, polyol compounds, multifunctional carboxyl compounds, aldehyde compounds, multifunctional (meth)acrylate compounds, multifunctional vinyl compounds, multifunctional mercapto compounds, multifunctional metal salt compounds, polyalkoxysilane compounds and hydrolyzates thereof, polyalkoxytitanium compounds and hydrolyzates thereof, polyalkoxyaluminum compounds and hydrolyzates thereof, polymethylol compounds and polyalkoxymethyl compounds. It is also possible to add well-known reaction catalysts to accelerate the reaction.

The amount thereof used is from 1% to 50% by weight, preferably from 3% to 40% by weight, and more preferably from 5% to 35% by weight, based on the total weight of solid contained in a coating solution for the light-heat conversion layer.

Sol-gel convertible systems applicable to the formation of the inorganic hydrophilic matrixes of the hydrophilic layers of the invention are polymers in which binding groups extending from multivalent elements form network structures through oxygen atoms and the multivalent metals have unbonded hydroxyl groups or alkoxyl groups at the same time to form resinous structures containing mixtures thereof. The polymers are in the sol state at a stage that there are many alkoxyl groups or hydroxyl groups, but the network resinous structures become strong with the progress of ether bonding. Further, they also have together the action that the hydroxyl groups are partly bonded to fine solid particles, thereby modifying the surfaces of the fine solid particles to change the hydrophilicity. Examples of the multivalent binding elements of compounds having the hydroxyl groups or alkoxyl groups performing the sol-gel conversion are aluminum, silicon, titanium and zirconium, which can be used in the invention. Sol-gel conversion systems due to siloxane bonds which can be most preferably used are described below. Sol-gel conversion using aluminum, titanium and zirconium can be conducted by replacing each element for silicon described below.

That is to say, particularly preferably used are systems containing silane compounds each having at least one sol-gel convertible silanol group.

The systems utilizing sol-gel conversion are further described below. Inorganic hydrophilic matrixes formed by sol-gel conversion are preferably resins having siloxane bonds and silanol groups, and hydrolysis condensation of the silanol groups progresses during coating, drying and the elapse of time of coating solutions which are sol systems containing silane compounds each having at least one silanol group to form structures of siloxane skeletons, thus forming the matrixes by the progress of gelation.

For improving physical properties such as film strength and flexibility, improving coating properties, and adjusting hydrophilicity, it is also possible to add the above-mentioned organic hydrophilic polymers and cross-linking agents to the matrixes of the gel structure.

A siloxane resin forming the gel structure is represented by the following formula (I), and a silane compound having at least one silanol group is obtained by hydrolysis of a silane compound represented by the following formula (II). Further, the silane compound having at least one silanol group is not necessarily composed of the partially hydrolyzed product of the silane compound of formula (II) alone. In general, it may be composed of either an oligomer obtained by partial hydration polymerization of the silane compound, or a mixture of the silane compound and its oligomer.

(I)

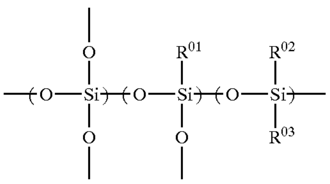

The siloxane resin of the above-mentioned formula (I) is formed by sol-gel coversion of at least one silane compound represented by the following formula (II). At least one of $R^{01}$ to $R^{03}$ in formula (I) represents a hydroxyl group, and the others each represents an organic residue selected from symbols $R^0$ and Y in the following formula (II).

$$(R^0)_nSi(Y)_{4-n} \quad (II)$$

wherein $R^0$ represents a hydroxyl group, a hydrocarbon group or a heterocyclic group; Y represents a hydrogen atom, a halogen atom (which represents a florine, chlorine, bromine or iodine atom), —$OR^1$, —$OCOR^2$ or —$N(R^3)(R^4)$ (wherein $R^1$ and $R^2$ each represents a hydrocarbon group, and $R^3$ and $R^4$ , which may be the same or different, each represents a hydrogen atom or a hydrocarbon group); and n represents 0, 1, 2 or 3.

Examples of the hydrocarbon groups or the heterocyclic groups represented by formula (II) include a substituted or unsubstituted straight chain or branched alkyl group having from 1 to 12 carbon atoms (e.g., methyl, ethyl, propyl, butyl, pentyl, hexyl, heptyl, octyl, nonyl, decyl, dodecyl, each of which may be substituted with at least one substituent such as a halogen atom (chlorine, fluorine, bromine), a hydroxyl group, a thiol group, a carboxyl group, a sulfo group, a cyano group, an epoxy group, an —OR' group (wherein R' represents methyl, ethyl, propyl, butyl, heptyl, hexyl, octyl, decyl, propenyl, butenyl, hexenyl, octenyl, 2-hydroxyethyl, 3-chloropropyl, 2-cyanoethyl, N,N-dimethyl-aminoethyl, 1-bromoethyl, 2-(2-methoxyethyl)oxyethyl, 2-methoxycarbonylethyl, 3-carboxypropyl or benzyl), an —OCOR" group (wherein R' has the same meaning as R'), a —COOR" group, a —COR" group, an —N(R''') (R''') group (wherein R''' represents a hydrogen atom or the same group as R', which may be the same or different) an —NHCONHR''' group, an —NHCOOR" group, an —Si $(R")_3$ group, a —CONHR''' group or an —NHCOR" group); a substituted or unsubstituted straight chain or branched alkenyl group having from 2 to 12 carbon atoms (e.g., vinyl, propenyl, butenyl, pentenyl, hexenyl, octenyl, decenyl, dodecenyl, each of which may be substituted with the same substituent as described above for the alkyl groups; a substituted or unsubstituted aralkyl group having from 7 to 14 carbon atoms (e.g., benzyl, phenetyl, 3-phenylpropyl, naphthylmethyl, 2-naphthylethyl, each of which may be substituted with at least one substituent which is the same as described above for the alkyl group); a substituted or unsubstituted alicyclic group having from 5 to 10 carbon atoms (e.g., cyclopentyl, cyclohexyl, 2-cyclohexylethyl, 2-cyclopentylethyl, norbornyl, adamantyl, each of which may be substituted with at least one substituent which is the same as described above for the alkyl group); a substituted or unsubstituted aryl group having from 6 to 12 carbon atoms (e.g, phenyl, naphthyl, each of which may be substituted with at least one substituent which is the same as described above for the alkyl group); and a heterocyclic group, which may be ring-condensed, containing at least one atom selected from a nitrogen atom, an oxygen atom and a sulfur atom (examples of the heterocycles include a pyran ring, a furan ring, a thiophene ring, a morpholine ring, a pyrrole ring, a thiazole ring, an oxazole ring, a pyridine ring, a piperidine ring, a pyrrolidone ring, a benzothiazole ring, a benzoxazole ring, a quinoline ring and a tetrahydrofuran ring, each of which may be substituted with at least one substituent which is the same as described above for the alkyl group).

Substituents of an —OR' group, an —$OCOR^2$ group or an —$N(R^3)(R^4)$ group indicated by Y in formula (II) are as follows.

In the —$OR^1$ group, $R^1$ represents a substituted or unsubstituted aliphatic group having from 1 to 10 carbon atoms (e.g, methyl, ethyl, propyl, butoxy, heptyl, hexyl, pentyl, octyl, nonyl, decyl, propenyl, butenyl, heptenyl, hexenyl, octenyl, decenyl, 2-hydroxyethyl, 2-hydroxypropyl, 2-methoxyethyl, 2-(methoxyethyloxo)ethyl, 1-(N,N-diethylamino)ethyl, 2-methoxypropyl, 2-cyanoethyl, 3-methyloxapropyl, 2-chloroethyl, cyclohexyl, cyclopentyl, cyclooctyl, chlorocyclohexyl, methoxycyclohexyl, benzyl, phenetyl, dimethoxybenzyl, methylbenzyl, bromobenzyl.

In the —$OCOR^2$ group, $R^2$represents the same aliphatic group as in $R^1$, or a substituted or unsubstituted aromatic group having from 6 to 12 carbon atoms (e.g., the same aryl groups as described for $R^0$).

In the —$N(R^3)$ $(R^4)$ group, $R^3$ and $R^4$, which may be the same or different, each represents a hydrogen atom, or a substituted or unsubstituted aliphatic group having from 1 to 10 carbon atoms (e.g., the same groups as described above for $R^1$ in the —$OR^1$ group).

More preferably, the total carbon atoms contained in $R^3$and $R^4$ are 16 or less.

Specific examples of the silane compounds represented by formula (II) include but are not limited to the following compounds: tetrachlorosilane, tetrabromosilane, tetramethoxysilane, tetraethoxysilane, tetraisopropoxysilane, tetra-n-propylsilane, tetra(t-butoxy) silane, tetra(n-butoxy)silane, dimethoxydiethoxysilane, methyltrichlorosilane, methyltribromosilane, methyltrimethoxysilane, methyltriethoxysilane, methyltriisopropoxysilane, methyltri (t-butoxy) silane, ethyltrichlorosilane, ethyltribromosilane, ethyltrimethoxysilane, ethyltriethoxysilane, ethyltriisopropoxysilane, ethyltri(t-butoxy)silane, n-propyltrichlorosilane, n-propyl-tribromosilane, n-propyltrimethoxysilane, n-propyltriethoxy-silane, n-propyltriisopropoxysilane, n-propyltri(t-butoxy)-silane, n-hexyltrichlorosilane, n-hexyltribromosilane, n-hexyltrimethoxysilane, n-hexyltriethoxysilane, n-hexyltri-isopropoxysilane, n-hexyltri(t-butoxy)silane, n-decyltri-chlorosilane, n-decyltribromosilane, n-decyltrimethoxysilane, n-decyltriethoxysilane, n-decyltriisopropoxysilane, n-decyltri(t-butoxy)silane, n-octadecyltrichlorosilane, n-octadecyl-tribromosilane, n-octadecyltrimethoxysilane, n-octadecyltri-ethoxysilane, n-octadecyl-tri(t-butoxy)silane, phenyltrichlorosilane, phenyltribromo-silane, phenyltrimethoxysilane, phenyltriethoxysilane, phenyltriisopropoxysilane, phenyltri (t-butoxy)silane, dimethyldichlorosilane, dimethyldibromosilane, dimethyl-dimethoxysilane, dimethyldiethoxysilane, diphenyldichloro-silane, diphenyldibromosilane, diphenyldimethoxysilane, diphenyldiethoxysilane, phenylmethyldichlorosilane, phenylmethyldibromosilane, phenylmethyldimethoxysilane, phenylmethyldiethoxysilane, triethoxyhydrosilane, tribromohydrosilane, trimethoxyhydrosilane, triisopropoxyhydrosilane, tri(t-butoxy)hydrosilane, vinyltrichlorosilane, vinyltribromosilane, vinyltrimethoxysilane, vinyltriethoxysilane, vinyltriisopropoxysilane, vinyl(t-butoxy)silane, trifluoropropyltrichlorosilane, trifluoropropyltribromosilane, trifluoropropyltrimethoxysilane, trifluoropropyltriethoxysilane, trifluoropropyltriisopropoxysilane, trifluoropropyltri(t-butoxy)silane, γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri (t-butoxy)silane, γ-methacryloxypropylmethyldimethoxysilane, γ-methacryloxypropylmethyldiethoxysilane, γ-methacryloxypropyltrimethoxysilane, γ-methacryloxypropyltriisopropoxysilane, γ-methacryloxypropyltri(t-butoxy)silane, γ-aminopropylmethyldi-methoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri (t-butoxy)-silane, γ-mercaptopropylmethyldimethoxysilane, γ-mercapto-propylmethyldiethoxysilane, γ-mercaptopropyltrimethoxysilane, γ-mercaptopropyltriethoxysilane, γ-mercaptopropyltriisopropoxysilane, γ-mercaptopropyltri (t-butoxy) silane, β-(3,4-epoxycyclohexyl) ethyltrimethoxysilane and β-(3,4-epoxycyclohexyl) ethyltriethoxysilane.

In combination with the silane compounds represented by formula (II) for use in;the formation of the inorganic hydrophilic matrixes of the hydrophilic layers of the invention, metal compounds capable of film-forming by bonding to resins in sol-gel conversion, such as Ti, Zn, Sn, Zr and Al compounds, can be used. Examples of the metal compounds usable in combination include Ti $(OR^5)_2$ (wherein $R^5$ is methyl, ethyl, propyl, butyl, pentyl or hexyl), $TiCl_4$, $Ti(CH_3COCHCOCH_3)_2(OR^5)_2$, Zn $(OR^5)_2$, Zn $(CH_3COCHCOCH_3)_2$, Sn $(OR^5)_4$, Sn $(CH_3COCHCOCH_3)_4$, $Sn(OCOR^5)_4$, $SnCl_4$, $Zr(OR^5)_4$, $Zr(CH_3COCHCOCH_3)_4$, $Al(OR^5)_3$ and $Al(CH_3COCHCOCH_3)_3$.

Further, it is preferred to use an acidic or basic catalyst for accelerating the hydrolysis and polycondensation reaction of the silane compound represented by formula (II) and the above-mentioned metal compound used in combination therewith.

The catalyst used for the above purpose is an acidic or basic compound as it is or dissolved in water or a solvent such as alcohol (such a compound is hereinafter referred to as an acidic catalyst or a basic catalyst, respectively). The concentration of the catalyst is not particularly restricted, but when the catalyst with high concentration is used, the hydrolysis rate and the polycondensation rate are liable to be increased. However, since the basic catalyst used in a high concentration sometimes causes precipitation in the sol solution, it is preferred that the basic catalyst concentration be not higher than 1 N (the concentration in the aqueous solution).

The kind of acid catalyst or basic catalyst is not particularly limited. Specific examples of the acid catalysts include hydrogen halides such as hydrochloric acid, nitric acid, sulfuric acid, sulfurous acid, hydrogen sulfide, perchloric acid, hydrogen peroxide, carbonic acid, carboxylic acids such as formic acid and acetic acid, substituted carboxylic acids in which R of the structural formula represented by RCOOH is substituted by another element or substituent, and sulfonic acids such as benzenesulfonic acid. Specific examples of the basic catalysts include ammoniacal bases such as aqueous ammonia and amines such as ethylamine and aniline.

Further details of the sol-gel method described above are described in the literatures such as Sumio Sakibana, "Science of Sol-GelMethods", published by Agune Shofusha (1988) and Seki Hirashima, "Techniques for Preparing Functional Thin Films by the Newest Sol-Gel Methods", published by Sogo Gijutsu Center (1992).

In addition to the above-mentioned additives, various compounds, for example, for controlling the degree of hydrophilicity, improving the mechanical strength of the hydrophilic layers, improving the mutual dispersibility of the compositions constituting the layers, improving the coating properties and improving the printability can be added to the hydrophilic layers of the invention. Examples thereof include plasticizers, pigments, dyes, surfactants and hydrophilic particles.

Although there is no particular limitation on the hydrophilic particles, preferred examples thereof include silica, alumina, titanium oxide, magnesium oxide, magnesium carbonate and calcium alginate. They can be used for enhancing the hydrophilicity and strengthening the coatings. More preferred are silica, alumina, titanium oxide and mixtures thereof.

Silica has many hydroxyl groups on its surface, and the inside thereof constitutes the siloxane bond (—Si—O—Si). Silica which can be preferably used in the invention is an ultrafine silica particle having a particle size of 1 nm to 100 nm dispersed in water or a polar solvent, and also called colloidal silica. Specifically, it is described in "Application Techniques of High Purity Silica" supervised by Tosiro Kagami and Ei Hayashi, vol. 3, CMC Corporation (1991).

Further, alumina which can be preferably used is an alumina hydrate (boehmite based) having a colloid size of 5 nm to 200 nm, and one in which alumina particles are dispersed using an anion in water (for example, a halogen atom ion such as a fluorine ion or a chlorine ion, or a carboxylic acid anion such as an acetic acid ion) as a stabilizer.

Furthermore, titanium oxide which can be preferably used is anatase or rutile titanium oxide having an average primary particle size of 50 nm to 500 nm, dispersed in water or a polar solvent using a dispersing agent as needed.

In the invention, the average primary particle size of the hydrophilic particles which can be preferably used is from 1 nm to 5000 nm, and preferably from 10 nm to 1000 nm.

In the hydrophilic layers of the invention, these hydrophilic particles may be used either alone or as a combination of two or more kinds of them. The amount thereof used is from 5% to 80% by weight, preferably from 10% to 70% by weight, and more preferably from 20% to 60% by weight, based on the total solid weight of hydrophilic layer.

The compositions for the hydrophilic layers used in the invention are dissolved or dispersed in appropriate solvents, for example, water or polar solvents such as methanol and ethanol, and applied onto the light-heat conversion layers, dried and hardened. The solvents may be used either alone or as a mixed solvent thereof.

The weight thereof coated is suitably from 0.1 $g/m^2$ to 20 $g/m^2$, preferably from 0.3 $g/m^2$ to 10 $g/m^2$, and more preferably from 0.5 $g/m^2$ to 5 $g/m^2$, by weight after drying. Less than 0.1 $g/m^2$ gives unfavorable results such as a reduction in fountain solution retaining ability and a decrease in film strength, whereas exceeding 20 $g/m^2$ results in a tendency to increase the consumption of ink, which is economically disadvantageous.

The supports used in the lithographic printing plate precursors of the invention are required to have such flexibility that they can be set on an ordinary printing machine and withstand the load imposed in printing at the same time. Accordingly, typical examples of the supports include coated paper, metal plates such as aluminum plates, plastic films such as polyethylene terephthalate films, and rubber or composite materials thereof. More preferred are aluminum plates, aluminum-containing alloy plates (for example, plates of alloys of aluminum with metals such as silicon, copper, manganese, magnesium, chromium, zinc, lead, bismuth and nickel) and plastic films. The thickness of the support is suitably from 25 $\mu$m to 3 nm, and preferably from 75 $\mu$m to 500 $\mu$m. However, it varies depending on the kind of support used and the printing conditions. In general, it is most preferably from 100 $\mu$m to 300 $\mu$m.

In the lithographic printing plate precursor of the invention, the support can be subjected to surface treatment such as corona treatment, or a primer layer can be provided between the support and the light-heat conversion layer, for improving the adhesion between the support and the light-heat conversion layer and improving the printability. The primer layers used in the invention include, for example, layers of various photosensitive polymers exposed and hardened before lamination with photosensitive resin layers as disclosed in JP-A-60-22903 (the term "JP-A" as used herein means an "unexamined published Japanese patent application"), layers of heat-cured epoxy resins disclosed in JP-A-62-50760, layers of hardened gelatin disclosed in JP-A-63-133151, layers using urethane resins and silane coupling agents disclosed in JP-A-3-200965 and layers using urethane resins disclosed in JP-A-3-273248. In addition, a layer obtained by hardening gelatin or casein is also effective. Further, for softening the primer layers, polymers whose glass transition temperature is lower than room temperature may be added to the primer layers. Such polymers include polyurethanes, polyamides, styrene/butadiene rubber, carboxy-modified styrene/butadiene rubber, acrylonitrile/butadiene rubber, carboxy-modified acrylonitrile/butadiene rubber, polyisoprene, acrylate rubber, polyethylene, chlorinated polyethylene and chlorinated polypropylene. The polymers may be added in any amount, and the primer layers may be formed by the polymers alone, as long as the amount thereof is within the range of being able to form film layers. Further, the primer layers can also contain additives such as dyes, pH indicators, printing-out agents, photopolymerization initiators, adhesion aids (for example, polymerizable monomers, diazo resins and silane coupling agents), pigments, silica powder and titanium oxide powder, answering the above-mentioned purposes. Further, the primer layers can also be hardened by exposure after coating. In general, the amount of the primer layer coated is suitably from 0.1 $g/m^2$ to 10 $g/m^2$, preferably from 0.3 $g/m^2$ to 8 $g/m^2$, and more preferably from 0. 5 $g/m^2$ to 5 $g/m^2$, by weight after drying.

In the lithographic printing plate precursor of the invention, a hydrophilic protective layer may be formed on the hydrophilic layer, for the purpose of protecting the surface hydrophilicity of the hydrophilic layer. It is preferred that the hydrophilic protective layer is easily removed with water or a fountain solution. The hydrophilic protective layers can be provided by applying and drying water-soluble polymers such as polyvinyl alcohol (polyvinyl acetate having a degree of saponification of 60% or more), modified polyvinyl alcohol such as carboxy-modified polyvinyl alcohol, starch and derivatives thereof, cellulose derivatives such as carboxymethyl cellulose, salts thereof and hydroxyethyl cellulose, casein, gelatin, gum arabic, polyvinylpyrrolidone, vinyl acetate-crotonic acid copolymers, styrene-maleic acid copolymers, polyacrylic acid and salts thereof, polymethacrylic acid and salts thereof, polyethylene glycol and polyethyleneimine. In this case, the dry weight of the hydrophilic protective layer is preferably from 0.01 $g/m^2$ to 5 $g/m^2$, and more preferably from 0.05 $g/m^2$ to 2 $g/m^2$.

In the invention, laser light energy used for recording is absorbed by the light-heat conversion layer of the lithographic printing plate precursor of the invention and converted to heat energy to cause chemical reactions or physical changes such as combustion, fusion, decomposition, vaporization and explosion at a part of the light-heat conversion layer, resulting in a reduction in adhesion between the light-heat conversion layer and the hydrophilic layer. Only the occurrence of the above-mentioned changes at a part of a surface of the light-heat conversion layer suffices for reducing the adhesion between the light-heat conversion layer and the hydrophilic layer, which is advantageous also in sensitivity. It becomes unnecessary to provide a primer layer (a layer under the light-heat conversion layer) for giving the function as an ink-receptive layer or preventing heat energy from being scattered and lost by heat conduction.

In the invention, laser light is used for exposing the lithographic printing plate precursors. There is no particular limitation on lasers used, as long as they provide exposure necessary for causing a reduction in adhesion enough to remove the hydrophilic layers. Gas lasers such as Ar lasers and carbon dioxide lasers, solid lasers such as YAG lasers, and semiconductor lasers can be used. Usually, lasers having an output of 50 mW or more are required. In practical respects of maintenance and cost, semiconductor lasers and semiconductor-excited solid lasers (such as YAG lasers) are suitably used. The recording wavelength of these lasers is within the range of infrared wavelength, and an oscillating wavelength of 800 nm to 1100 nm is utilized in many cases. Further, it is also possible to expose the lithographic printing plate precursors, using an imaging apparatus described in JP-A-6-186750.

For the lithographic printing plate precursors of the invention laser-exposed by the above-mentioned methods, the hydrophilic layers of laser-exposed areas (image areas) may be removed during laser exposure, and are removed after laser exposure if necessary to expose the remaining light-heat conversion layers acting as ink-receptive areas.

The hydrophilic layers of laser-exposed areas (image areas) are removed, for example, by suction, pressing contact and separation of adhesive tapes, or rubbing precursor surfaces with rubbing members such as pads for development and brushes for development in the presence or absence of processing solutions.

The processing solutions used in the invention are preferably water or aqueous solutions mainly composed of water, from the viewpoints of safety, inflammability and retaining of surface hydrophilicity of the hydrophilic layers. Only water (city water, pure water or distilled water) and aqueous solutions of surfactants (anionic, cationic and nonionic) can be used.

Further, examples of solvents usable in the processing solutions of the invention include, for example, aliphatic hydrocarbons (such as hexane, heptane, "Isopar E, H, G" manufactured by Esso Kagaku K. K., gasoline and Kerosine), aromatic hydrocarbons (such as toluene and xylene), halogenated hydrocarbons (such as trichlene) and the following polar solvents.

Examples of the polar solvents include, for example, alcohols (such as methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol and tetraethylene glycol); ketones (such as acetone and methyl ethyl ketone); esters (such as ethyl acetate, methyl lactate, butyl lactate, propylene glycol monomethyl ether acetate, diethylene glycol acetate and diethyl phthalate); and others (such as triethyl phosphate and tricresyl phosphate).

It is also possible to add water to the organic solvent processing solutions, or to solubilize the organic solvents in water using surfactants. When the processing solution contains the solvent, the concentration of the solvent is desirably less than 40% by weight.

Further, the processing solutions containing alkaline agents (for example, sodium carbonate, triethanolamine, diethanolamine, sodium hydroxide and silicates) or acidic agents (for example, phosphoric acid, phosphorous acid, metaphosphoric acid, pyrophosphoric acid, oxalic acid, malic acid, tartaric acid, boric acid and amino acids) can also be used.

The processing solutions can be used at any temperature, preferably at a temperature of 10° C to 50° C.

The hydrophilic layers of laser-exposed areas can also be removed, for example, by mounting the laser-exposed printing plates on a plate cylinder of a printing machine, and bringing the printing plates into contact with an application roller of a fountain solution and/or ink on the printing machine.

EXAMPLES

The invention will be further illustrated in greater detail with reference to the following examples, which are, however, not to be construed as limiting the invention.

Examples 1 to 5

(Support)

As a primer layer, a gelatin undercoat layer was formed on a 175-μm thick polyethylene terephthalate film so as to give a dry film thickness of 0.5 μm.

(Preparation of Carbon Black Dispersion)

The following mixed solution was dispersed in a paint shaker for 30 minutes, followed by separation of glass beads by filtration to prepare a carbon black dispersion.

| | |
|---|---|
| Carbon Black (MA 100 manufactured by Mitsubishi Chemical Corp.) | 4.0 g |
| Solsperse S 20000 (manufactured by ICI) | 0.27 g |
| Solsperse S 12000 (manufactured by ICI) | 0.22 g |
| Propylene Glycol Monomethyl Ether | 10 g |
| Methyl Ethyl Ketone | 10 g |
| Glass Beads | 120 g |

(Preparation of Light-Heat Conversion Layer)

The following coating solution was applied onto the above-mentioned polyethylene terephthalate film undercoated with gelatin, and dried by heating (120° C., 1 minute), thereby forming a light-heat conversion layer having a dry weight of 1 g/m$^2$.

| | |
|---|---|
| Carbon Black Dispersion (described above) | 25 g |
| Binder Polymer (see Table 1) | 10 g |
| Cross-Linking Agent (see Table 1) | 1 g |
| Propylene Glycol Monomethyl Ether | 45 g |
| Methyl Ethyl Ketone | 45 g |

TABLE 1

| | Binder Polymer | Cross-Linking Agent |
|---|---|---|
| Example 1 | Phenol novolak | Hexamethylolmelamine |
| Example 2 | Butyral resin (Denka Butyral #3000-2 manufactured by Denki Kagaku Kogyo K.K.) | Diphenylmethane diisocyanate |
| Example 3 | Methyl methacrylate/ methyl acrylate/ hydroxyethyl methacrylate copolymer (molar ratio: 65/20/15) | N-(β-Aminoethyl)-γ-amino-propyltrimethoxysilane |
| Example 4 | Polyurethane resin (Diphenylmethane diisocyanate/isophorone isocyanate/butanediol molar ratio: 20/28/50) | 75% isopropanol solution of titanium diisopropoxide bis(2,4-pentadienoate) (AKT855 manufactured by Chisso Co., Ltd.) |
| Example 5 | Methyl methacrylate/ methyl acrylate/ glycidyl methacrylate copolymer (molar ratio: 60/15/25) | Diethylenetriamine |

(Formation of Hydrophilic Layer)

The following coating solution was applied onto the above-mentioned light-heat conversion layer, and dried by heating (100° C., 10 minutes), thereby forming a hydrophilic layer having a dry weight of 2 g/m$^2$.

| | |
|---|---|
| Aqueous Dispersion of 20% Titanium Oxide And 10% Polyvinyl Alcohol (titanium oxide (manufactured by Wako Pure Chemical Industries Ltd., rutile type, average particle size: 200 nm)/PVA 117 (manufactured by Kuraray Co., Ltd.) = 2/1 by weight ratio) | 8 g |
| 20% Aqueous Dispersion of Silica Gel (Snowtex C manufactured by Nissan Chemical Industries, Ltd., average particle size: 10 nm) | 4 g |
| Sol-Gel Preparation Solution (Composition shown below) | 4 g |
| Water | 20 g |

(Preparation of Sol-Gel Preparation Solution)

A solution of the following composition was matured at room temperature for 1 hour to prepare a sol-gel preparation solution.

| | |
|---|---|
| Tetramethoxysilane | 11.0 g |
| Ethanol | 20.7 g |
| 0.1 N Nitric Acid | 4.5 g |

(Evaluation of Printability)

Using a semiconductor laser having an output of 750 mW, a wavelength of 830 nm and a beam diameter of 25 μm (1/e$^2$), each of the lithographic printing plate precursors of the invention obtained above was image exposed at a main scanning speed of 3 m/second from the hydrophilic layer side, and then, each precursor surface was wiped with a pad for development impregnated with water to expose the remaining light-heat conversion layer of a laser-exposed area. At this time, the optical density of an image area was about 1.5 On the other hand, the optical density of a non-image area was about 3.0, and halftone dots of 175 lpi could be formed on a plate at an area rate of 2% to 98%. The optical density was measured with a D19C type reflection densitometer manufactured by GRETAG Co.

Each of the lithographic printing plates thus formed was mounted on a printing machine (RYOBI 3200 MCD), and printing was conducted, using a 1 vol % aqueous solution of EU-3 (manufactured by Fuji Photo Film Co., Ltd.) as a fountain solution, and TK Highecho Sumi Ink MZ (manufactured by Toyo Ink Mfg. Co., Ltd.) as ink. Before the start of printing, rolling up with the fountain solution was carried out 20 times. Then, the ink was supplied to start printing. As a result, 20,000 stainless good printed sheets were obtained.

Comparative Example 1

A lithographic printing plate was formed in the same manner as with Example 1, with the exception that 1.43 g of nitrocellulose (manufactured by Nakaraitesuku Co., containing 30% of 2-propanol, polymerization degree: 80) was used as the binder polymer for the light-heat conversion layer, and no cross-linking agent was added. As a result, a surface of the primer layer on the support was exposed at a laser-exposed area. Using the lithographic printing plate thus formed, printing was conducted in the same manner as in Example 1. As a result, the ink receptivity thereof at an image area was poor, and good printed matter was not obtained.

Examples 6 to 8

(Formation of Support and Light-Heat Conversion Layer)

The same light-heat conversion layer as that of Example 5 was formed on a 175-μm thick polyethylene terephthalate film a surface of which was corona treated.

(Formation of Hydrophilic Layer)

The following coating solution was applied onto the above-mentioned light-heat conversion layer, and dried by heating (100° C., 10 minutes), thereby forming a hydrophilic layer having a dry weight of 2 g/$m^2$.

| | |
|---|---|
| Hydrophilic Binder (see Table 2) | 5 g |
| Cross-Linking Agent (see Table 2) | 1 g |
| 40% Aqueous Dispersion of Silica Gel (Snowtex ZL manufactured by Nissan Chemical Industries, Ltd., average particle size: 70 to 100 nm) | 7.5 g |
| Water | 76.5 g |

TABLE 2

| | Binder Polymer | Cross-Linking Agent |
|---|---|---|
| Example 6 | Polyacrylic acid (manufactured by Wako Pure Chemical Industries Ltd., average molecular weight: 25,000) | Polyethylene glycol diglycidyl ether (Epolite 400E manufactured by Kyoeisha Kagaku Co., Ltd.) |
| Example 7 | Polyvinyl alcohol (PVA 105 manufactured by Kuraray Co., Ltd.) | 80% isopropanol solution of titanium bis(triethanolamine) diisopropoxide (AKT845 manufactured by Chisso Co., Ltd.) |
| Example 8 | 1/1 mixture of polyethyleneimine (manufactured by Wako Pure Chemical Industries Ltd., average molecular weight: 10000)/ polyvinyl alcohol (PVA 105 manufactured by Kuraray Co., Ltd.) | 40% aqueous solution of glyoxal (manufactured by Wako Pure Chemical Industries) |

(Evaluation of Printability)

Using a semiconductor laser having an output of 750 mW, a wavelength of 830 nm and a beam diameter of 25 μm (11$e^2$), each of the lithographic printing plate precursors of the invention obtained above was image exposed at a main scanning speed of 3 m/second from the hydrophilic layer side, and then, each precursor surface was wiped with a pad for development impregnated with water to expose the remaining light-heat conversion layer of a laser-exposed area. At this time, the optical density of an image area was about 1.5. On the other hand, the optical density of a non-image area was about 3.0, and halftone dots of 175 lpi could be formed on a plate at an area rate of 2% to 98%.

Each of the lithographic printing plates thus formed was mounted on a printing machine (RYOBI 3200 MCD), and printing was conducted, using a 10 vol % aqueous solution of SLM-OD (manufactured by Mitsubishi Paper Mills, Ltd.) as a fountain solution, and T K Highecho Sumi Ink MZ (manufactured by Toyo Ink Mfg. Co., Ltd.) as ink. Before the start of printing, rolling up with the fountain solution was carried out 20 times. Then, the ink was supplied to start printing. As a result, 20,000 stainless good printed sheets were obtained.

Comparative Examples 2 to 4

Lithographic printing plates were formed and used for printing in the same manner as in Examples 6 to 8, respectively, with the exception that no cross-linking agents were added in the formation of hydrophilic layers. As a result, the hydrophilic layers of non-image areas were dissolved or eliminated, and the dissolved or eliminated portions were inked to cause overall stains over the non-image areas, resulting in failure to obtain good printed matter.

Examples 9 to 16

Printing was conducted in the same manner as in Examples 1 to 8, respectively, with the exception that the lithographic printing plates were mounted on the printing machine without treatment after laser image exposure. As a result, results similar to those of Examples 1 to 8 were obtained.

Examples 17 to 24

Printing was conducted in the same manner as in Examples 1 to 8, respectively, with the exception that laser image exposure was performed using a PEARL setter 74 plate setter manufactured by PRESSTEK Co. As a result, results similar to those of Examples 1 to 8,were obtained.

Comparative Example 5

A lithographic printing plate was formed in the same manner as in Example 4 with the exception that the dry weight of the light-heat conversion layer was changed to 0.09 g/$m^2$. As a result, the light-heat conversion layer of a laser-exposed area could not be removed because of its insufficient sensitivity, resulting in failure to form an ink-receptive image area.

Comparative Example 6

A lithographic printing plate was formed in the same manner as in Example 4 with the exception that the dry weight of the light-heat conversion layer was changed to 0.25 g/$m^2$. As a result, a surface of the primer layer on the support was exposed at a laser-exposed area. Further, the lithographic printing plate thus formed was used for printing in the same manner as in Example 1. As a result, the inking property at an image area was poor, resulting in failure to obtain good printed matter.

Examples 25 and 26

Lithographic printing plates were formed and used for printing in the same manner as in Example 4 in the exception that the dry weight of the light-heat conversion layer was changed to 0.5 g/$m^2$ and 2 g/$m^2$, respectively. As a result, results similar to those of Example 4 were obtained.

Comparative Example 7

A lithographic printing plate was formed in the same manner as with Example 4 with the exception that the dry weight of the light-heat conversion layer was changed to 4 g/$m^2$. At this time, the optical density of an image area was about 4.5, whereas the optical density of a non-image area was about 6, which caused a poor contrast between the image area and the non-image area to make plate inspection difficult. The lithographic printing plate thus formed was used for printing in the same manner as in Example 4. As a result, good printed matter was obtained similarly to Example 4. However, the image area was deeply recessed, so that it was necessary to set an ink scale higher than that of Example 4.

Example 27

(Support)

A 0.24-mm thick JIS A 1050 aluminum plate normally degreased was immersed in a 1% aqueous solution of an aminosilane coupling agent (KBM 603 manufactured by Shin-Etsu Chemical Co., Ltd.), followed by drying. The following coating solution for a primer layer was applied onto the aluminum plate so as to give a dry weight of 3g/$m^2$, and dried by heating at 140° C. for 2 minutes, followed by exposure at 20 counts, using a vacuum exposure apparatus (FT261 VUDNS ULTRA-PLUS FLIPOP PLATE MAKER manufactured by Anuk Co.).

(Coating Solution for Primer Layer)

| | |
|---|---|
| Polyurethane Resin (Sanprene IB1700D, manufactured by Sanyo Chemical Industries, Ltd.) | 10 g |
| Hexafluorophosphate of Condensation Reaction Product of p-Diazophenylamine and Paraformaldehyde | 0.1 g |
| Titanium Oxide | 0.1 g |
| Surfactant (MCF 323, manufactured by Dainippon Ink & Chemicals, Inc.) | 0.03 g |
| Propylene Glycol Methyl Ether Acetate | 50 g |
| Methyl Lactate | 20 g |
| Pure Water | 1 g |

(Formation of Light-Heat Conversion Layer)

The following coating solution was applied onto the above-mentioned primer layer, and dried by heating (120° C., 1 minute), thereby forming a light-heat conversion layer having a dry weight of 1 g/$m^2$.

| | |
|---|---|
| Infrared Absorption Dye A (described below) | 5 g |
| Cresol Novolak Resin (PR50904 manufactured by Sumitomo Dules Co.) | 5 g |
| Polyurethane Resin (Nippolan 2304 manufactured by Nippon polyurethane Industry Co., Ltd.) | 14 g |
| 75% Isopropanol Solution of Titanium Diisopropoxide Bis(2,4-pentadienoate) (AKT855 manufactured by Chisso Co., Ltd.) | 3 g |
| Propylene Glycol Monomethyl Ether | 50 g |
| Methyl Ethyl Ketone | 45 g |

<Infrared Absorption Dye A>

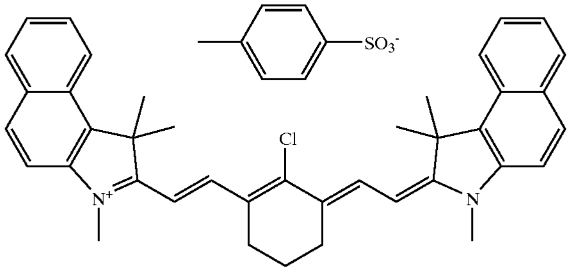

(Formation of Hydrophilic Layer)

A hydrophilic layer was formed on the light-heat conversion layer in the same manner as in Example 1.

Using a semiconductor laser having an output of 750 mW, a wavelength of 830 nm and a beam diameter of 25 μm (1/$e^2$), the lithographic printing plate precursor obtained above was image exposed at a main scanning speed of 3 m/second from the hydrophilic layer side, and then, a precursor surface was wiped with a pad for development impregnated with water to expose the remaining light-heat conversion layer of a laser-exposed area. As a result, halftone dots of 175 lpi could be formed on a plate at an area rate of 2% to 98%. The confirmation of the residual amount of the light-heat conversion layer of the laser-exposed area by SEM observation of a cross section of the printing plate showed that 85% thereof remained compared with the light-heat conversion layer of an area not irradiated with laser light.

The lithographic printing plate thus formed was mounted on a printing machine (RYOBI 3200 MCD), and printing was conducted, using a 1 vol % aqueous solution of EU-3 (manufactured by Fuji Photo Film Co., Ltd.) as a fountain solution. Before the start of printing, rolling up with the fountain solution was carried out 20 times. Then, the ink was supplied to start printing. As a result, 20,000 stainless good printed sheets were obtained.

As is apparent from the above results, the lithographic printing plates of the respective examples according to the invention were good in sensitivity, and gave satisfactory results with respect to print stains and printing durability. However, the lithographic printing plates of the respective comparative examples were poor in the ink receptivity to fail to obtain good printed matter, leading to unsatisfactory results.

As described above, according to the lithographic printing plate precursors and the plate-making method of the lithographic printing plates using the same, heat-mode image exposure with laser light is possible, plate making can be conducted by easy water-development processing or direct mounting on a printing machine, requiring no development processing, the printing durability is excellent, few print stains are developed on printed faces, and the image reproducibility is good.

While the invention has been described in detail and with reference to specific embodiments thereof, it will be apparent to one skilled in the art that various changes and modifications can be made therein without departing from the spirit and scope thereof.

What is claimed is:

1. A lithographic printing plate precursor comprising a support having thereon an ink-receptive light-heat conversion layer containing a compound converting laser light to heat and a hardened hydrophilic layer in this order, wherein a part of said light-heat conversion layer remains at a laser light-irradiated area of said lithographic printing plate precursor and wherein said light-heat conversion layer has a cross-linked structure which is cross-linked by at least one cross-linking agent selected from the group consisting of multifunctional isocyanate compounds, multifunctional epoxy compounds, multifunctional amine compounds, polyol compounds, multifunctional carboxyl compounds, aldehyde compounds, multifunctional (meth)acrylate compounds, multifunctional vinyl compounds, multifunctional merocapto compounds, multifunctional metal salt compounds, polyalkoxysilane compounds, polyalkoxytitanium compounds, polyalkoxyaluminum compounds, polymethylol compounds and polyalkoxymethyl compounds, is hardened and has a dry weight of 0.5 g/ml to 3 $g/m^2$, and wherein said hydrophilic layer is a layer receiving and retaining a fountain solution in printing using the fountain solution and ink, and functions as a non-image area.

2. A method for producing a lithographic printing plate comprising conducting heat-mode imagewise exposure by laser light irradiation to a lithographic printing plate precursor comprising a support having thereon an ink-receptive light-heat conversion layer containing a compound converting laser light to heat and a hardened hydrophilic layer in this order wherein said light-heat conversion layer has a cross-linked structure which is cross-linked by at least one cross-linking agent selected from the group consisting of multifunctional isocyanate compounds, multifunctional epoxy compounds, multifunctional amine compounds, polyol compounds, multifunctional carboxyl compounds, aldehyde compounds, multifunctional (meth)acrylate compounds, multifunctional vinyl compounds, multifunctional merocapto compounds, multifunctional metal salt compounds, polyalkoxysilane compounds, polyalkoxytitanium compounds, polyalkoxyaluminum compounds, polymethylol compounds and polyalkoxymethyl compounds, is hardened and has a dry weight of 0.5 $g/m^2$ to 3 $g/m^2$, and wherein a part of said light-heat conversion layer remains at a laser light-irradiated area of said g lithographic printing plate precursor, and during or after the laser light irradiation, removing the hydrophilic layer of the laser light-irradiated area, thereby forming an image of the ink-receptive light-heat conversion layer, and wherein said hydrophilic layer is a layer receiving and retaining a fountain solution in printing using the fountain solution and ink, and functions as a non-image area.

* * * * *